US010671297B2

(12) United States Patent
Park

(10) Patent No.: US 10,671,297 B2
(45) Date of Patent: Jun. 2, 2020

(54) MEMORY SYSTEM AND OPERATING METHOD THEREOF MANAGING COUNTING VALUES FOR SYSTEM OPERATIONS

(71) Applicant: SK hynix Inc., Gyeonggi-do (KR)

(72) Inventor: Chang-Hyun Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 58 days.

(21) Appl. No.: 15/862,770

(22) Filed: Jan. 5, 2018

(65) Prior Publication Data

US 2018/0335959 A1 Nov. 22, 2018

(30) Foreign Application Priority Data

May 16, 2017 (KR) .................. 10-2017-0060280

(51) Int. Cl.
*G06F 3/06* (2006.01)
*G11C 16/34* (2006.01)
*G06F 9/4401* (2018.01)
*G06F 12/02* (2006.01)

(52) U.S. Cl.
CPC ............ *G06F 3/0616* (2013.01); *G06F 3/064* (2013.01); *G06F 3/0629* (2013.01); *G06F 3/0679* (2013.01); *G06F 9/4401* (2013.01); *G06F 12/0246* (2013.01); *G11C 16/3495* (2013.01); *G06F 2212/7211* (2013.01)

(58) Field of Classification Search
None
See application file for complete search history.

(56) References Cited

U.S. PATENT DOCUMENTS

| 2004/0080985 | A1* | 4/2004 | Chang | ................. G06F 12/0246 365/185.33 |
| 2010/0023675 | A1* | 1/2010 | Chen | ................... G06F 12/0246 711/103 |
| 2013/0191700 | A1* | 7/2013 | Griffin | .................. G06F 11/008 714/759 |
| 2013/0282967 | A1 | 10/2013 | Ramanujan | |

FOREIGN PATENT DOCUMENTS

KR 1020030089314 11/2003

* cited by examiner

*Primary Examiner* — Charles J Choi
(74) *Attorney, Agent, or Firm* — IP & T Group LLP

(57) ABSTRACT

A memory system may include: a nonvolatile memory device comprising K memory blocks; and a controller suitable for controlling an operation of the nonvolatile memory device. The controller may include: a counting management unit suitable for using K count codes capable of counting a preset range from a base value to a limit value in order to manage K counting values corresponding to predetermined operations of the K memory blocks, respectively, and adjusting the absolute values of the base value and the limit value using the count code in the form of a 1/N-chain depending on a distribution of the K counting values; and a wear-leveling operation unit suitable for performing a wear-leveling operation on the K memory blocks such that the K counting values are distributed in a section of values corresponding to 1/N of the preset range, the count code may be a J-based number, each of J and K may be a natural number larger than 2, and N may be any one of powers of J larger than 1.

18 Claims, 10 Drawing Sheets

MEMORY SYSTEM AND OPERATING METHOD THEREOF MANAGING COUNTING VALUES FOR SYSTEM OPERATIONS

CROSS-REFERENCE TO RELATED APPLICATIONS

The present application claims priority of Korean Patent Application No. 10-2017-0060280, filed on May 16, 2017, which is incorporated herein by reference in its entirety.

BACKGROUND

1. Field

Various embodiments of the present disclosure relate to a memory system. Particularly, various embodiments of the present disclosure relate to a memory system capable of supporting a wear-leveling operation and an operating method thereof.

2. Description of the Related Art

The paradigm for computer environments has changed to ubiquitous computing systems that can be used anytime and anywhere. For this reason, use of portable electronic devices such as mobile phones, digital cameras, and laptop computers has rapidly increased. These portable electronic devices generally use a memory system having one or more memory devices for storing data. A memory system may be used as a main or an auxiliary storage device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments are directed to a memory system capable of efficiently managing counting values corresponding to predetermined operations performed in a plurality of memory blocks, and an operating method thereof.

In an embodiment, a memory system may include: a nonvolatile memory device comprising K memory blocks; and a controller suitable for controlling an operation of the nonvolatile memory device, the controller may include: a counting management unit suitable for using K count codes having N-bit sizes and representing numbers of predetermined operations performed on the K memory blocks within a preset range from a base value to a limit value in order to manage K counting values representing added numbers of the predetermined operations performed on the K memory blocks, respectively, and adjusting values of the base value and the limit value by using the count code in the form of a (N−1)-bit chain depending on a distribution of the K counting values; and a wear-leveling operation unit suitable for performing a wear-leveling operation on the K memory blocks such that the K counting values are distributed in one between lower and upper halves of the preset range, K may be a natural number greater than 2, and N may be a value of 2 to the powers of T, where T may be an integer equal to or greater than 1.

The counting management unit may reset a base code and a lower half code during a booting period, such that a join code corresponding to the minimum value of the K counting values, which are checked by joining the K count codes and the base code corresponding to the base value, is equal to or larger than the base code, and becomes smaller than the lower half code larger than the base code by a half value of the count code.

The counting management unit may reset a code to a limit code corresponding to the limit value, the code being obtained by adding a range code corresponding to the preset range to the base code reset during the booting period and subtracting 1 from the added value.

The wear-leveling operation unit may perform a first wear-leveling operation on the K memory blocks such that the join code corresponding to the maximum value of the K counting values managed by the counting management unit becomes smaller than the lower half code, during a wear-leveling period after the booting period.

When it is checked that the join code corresponding to the maximum value of the K counting values managed by the counting management unit is equal to or larger than the lower half code after the first wear-leveling operation was performed during the wear-leveling period, the wear-leveling operation unit may perform a second wear-leveling operation on the K memory blocks, such that the join code corresponding to the minimum value of the K counting values becomes equal to or larger than the lower half code, and the join code corresponding to the maximum value of the K counting values becomes smaller than an upper half code larger by a half value of the count code than the lower half code.

When it is checked that the join code corresponding to the minimum value of the K counting values is equal to or larger than the lower half code after the wear-leveling operation unit performed the second wear-leveling operation during the wear-leveling period, the counting management unit may reset the lower half code to the base code, resets a code to the limit code, the code being obtained by adding the range code to the base code reset during the wear-leveling period and subtracting 1 from the added value, may reset a code to the lower half code, the code being larger by a half value of the count code than the base code reset during the wear-leveling period, and may reset a code to the upper half code, the code being larger by a half value of the count code than the lower half code reset during the wear-leveling period.

The controller may read the base code from a predetermined memory block among the K memory blocks during the booting period, and when the base code is reset through the operation of the counting management unit during the booting period or the wear-leveling period, the controller may store the reset base code in the predetermined memory block.

The controller may further include a memory, the controller may read the K count codes from the respective K memory blocks or the predetermined block during the booting period or the wear-leveling period, and may control the memory to manage the read count codes, when a count code among the K count codes is updated by the predetermined operation after the booting period, the controller may store the updated count code in the corresponding memory blocks or the predetermined block at a preset point of time.

Each of the base code, the join code, the lower half code, the upper half code and the limit code may have the N-bit or greater size, and the range code may have (N+1)-bit size and a greater value than the maximum value of the count code by a value of 1.

The counting management unit may generate the join codes corresponding to the K counting values by adding the K count codes to the base code, respectively, during the booting period or the wear-leveling period.

In an embodiment, an operating method of a memory system which includes a nonvolatile memory device having K memory blocks, the operating method may include: managing K counting values representing added numbers of predetermined operations performed on the K memory blocks by using K count codes having N-bit sizes and representing numbers of the predetermined operations performed on the K memory blocks within a preset range from a base value to a limit value, respectively; adjusting values of the base value and the limit value by using the count code in the form of a (N−1)-bit chain depending on a distribution of the K counting values managed by the managing of the K counting values; and performing a wear-leveling operation on the K memory blocks such that the K counting values managed by the managing of the K counting values are distributed in one between lower and upper halves of the preset range, K may be a natural number greater than 2, and N may be a value of 2 to the powers of T, where T may be an integer equal to or greater than 1.

The adjusting of the values may include: a first check step of checking the K counting values by joining the K count codes and a base code corresponding to the base value during the booting period; and a first reset step of resetting the base code and a lower half code such that a join code corresponding to the minimum value of the K counting values checked in the first check step is equal to or larger than the base code, and becomes smaller than the lower half code larger than the base code by a half value of the count code.

The adjusting of the values may further include a second reset step of resetting a code to a limit code corresponding to the limit value, the code being obtained by adding a range code corresponding to the preset range to the base code reset in the first reset step and subtracting 1 from the added value.

The performing of the wear-leveling operation may include: a second check step of checking the K counting values by joining the K count codes and the base code corresponding to the base value during a wear-leveling period after the booting period; and a first leveling step of performing a wear-leveling operation on the K memory blocks such that the join code corresponding to the maximum value of the K counting values checked in the second check step becomes smaller than the lower half code.

The performing of the wear-leveling operation may further include a second leveling step of performing a wear-leveling operation on the K memory blocks such that the join code corresponding to the minimum value of the K counting values checked through the second check step becomes equal to or larger than the lower half code, and the join code corresponding to the maximum value of the K counting values becomes smaller than an upper half code larger by a half value of the count code than the lower half code, when it is checked that the join code corresponding to the maximum value of the K counting values checked through the second check step is equal to or larger than the lower half code, after the first wear-leveling operation.

The adjusting of the values may include: a third check step of checking the K counting values by joining the K count codes and the base code corresponding to the base value, after the second leveling step; and a third reset step of resetting the lower half code to the base code, resetting a code to the limit code, the code being obtained by adding the range code to the base code reset during the wear-leveling period and subtracting 1 from the added value, resetting a code to the lower half code, the code being larger by a half value of the count code than the base code reset the wear-leveling period, and resetting a code to the upper half code, the code being larger by a half value of the count code than the lower half code reset during the wear-leveling period, when it is checked that the join code corresponding to the minimum value of the K counting values checked through the third check step is equal to or larger than the lower half code.

The operating method may further include: reading the base code from a predetermined memory block of the K memory blocks during the booting period; and storing the base code reset during the booting period or the wear-leveling period into the predetermined memory block, in case where the base code is reset.

The memory system may further includes a memory, the operating method may further include: reading the K count codes from the respective K memory blocks or the predetermined block during the booting period or the wear-leveling period, and controlling the memory to manage the read count codes, and storing a count code among the K count codes into the corresponding memory blocks or the predetermined block at a preset point of time, when the count code is updated through the predetermined operation after the booting period.

Each of the base code, the join code, the lower half code, the upper half code and the limit code may have the N-bit or greater size, and the range code may have (N+1)-bit size and a greater value than the maximum value of the count code by a value of 1.

Each of the first to third check steps may include generating the join codes corresponding to the K counting values by adding the K count codes to the base code, respectively.

In an embodiment, a controller may include: a wear-leveling unit suitable for controlling a memory device to perform a wear-leveling operation to memory blocks of the memory device; and a counting unit suitable for: cyclically counting, within a fixed range, numbers of access operations performed to the memory blocks, respectively, and increasingly shifting a count window of the fixed range when one or more of the number of access operations reaches a maximum value of the fixed range, the wear-leveling unit may control the memory device to perform the wear-leveling operation to evenly distribute current numbers of the access operations.

In an embodiment, an operating method of a controller, the method may include: controlling a memory device to perform a wear-leveling operation to memory blocks of the memory device; cyclically counting, within a fixed range, numbers of access operations performed to the memory blocks, respectively; and increasingly shifting a count window of the fixed range when one or more of the number of access operations reaches a maximum value of the fixed range, the wear-leveling operation may be performed to evenly distribute current numbers of the access operations.

BRIEF DESCRIPTION OF THE DRAWINGS

Features and advantages of the present invention will become apparent to those skilled in the art to which the present invention pertains from the following detailed description in reference to the accompanying drawings, wherein.

DETAILED DESCRIPTION

Figure 1:
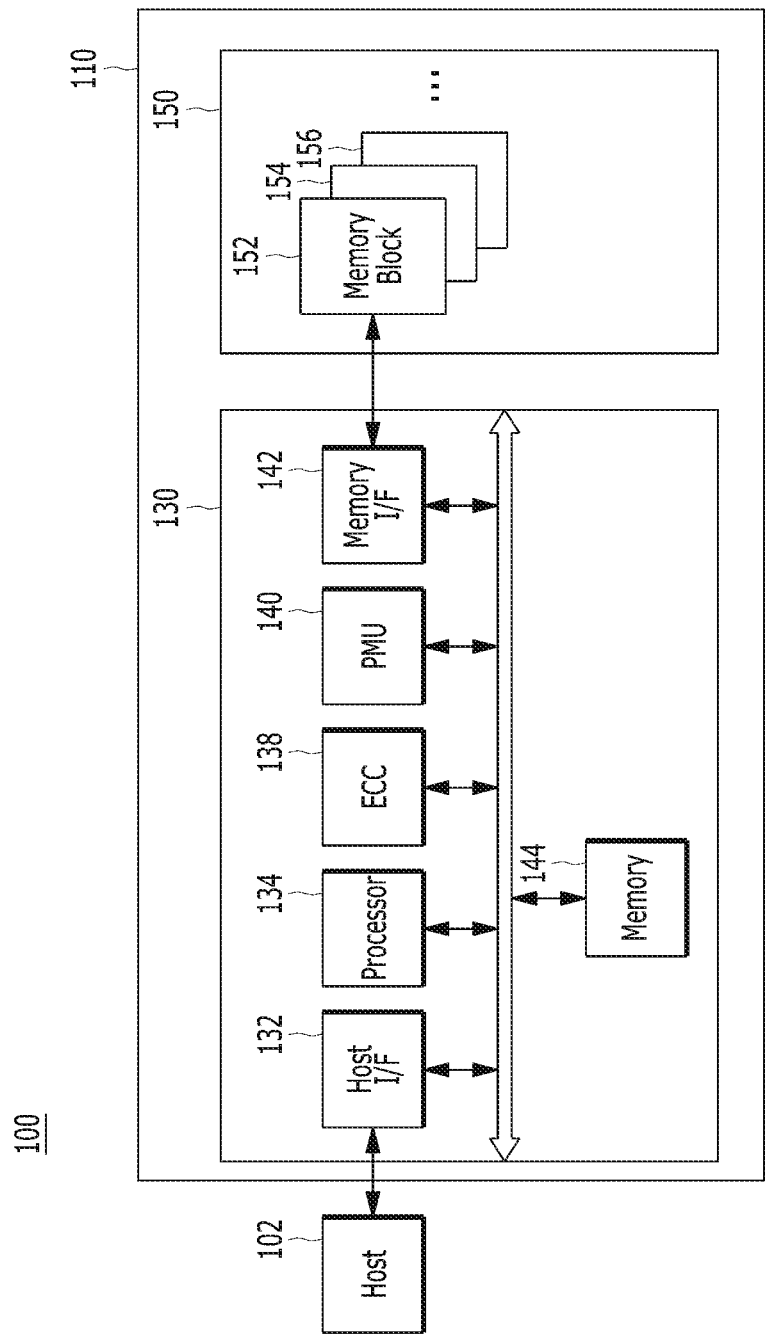
FIG. 1 is a block diagram illustrating a data processing system including a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include portable electronic devices such as a mobile phone, MP3 player, and laptop computer or non-portable electronic devices such as a desktop computer, game machine, TV, and projector.

The memory system 110 may store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card, and memory stick. The MMC may include an embedded MMC (eMMC), reduced size MMC (RS-MMC), and micro-MMC. The SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM), and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM), and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown). Each memory die may include a plurality of planes (not shown). Each plane may include a plurality of memory blocks 152 to 156. Each of the memory blocks 152 to 156 may include a plurality of pages. Each of the pages may include a plurality of memory cells, which are coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program, and erase operations of the memory device 150.

The controller 130 may include a host interface (I/F) unit 132, a processor 134, an error correction code (ECC) unit 138, a Power Management Unit (PMU) 140, a Memory I/F 142, and a memory 144 all operatively coupled via an internal bus. Memory I/F 142 may be a NAND flash controller (NFC).

The host interface unit 132 may process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI), and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems, or devices for error correction.

The PMU 140 may provide and manage power for the controller 130.

The Memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the Memory I/F 142 may generate a control signal for the memory device 150 and process data to be provided to the memory device 150 under the control of the processor 134. The Memory I/F 142 may work as an interface (e.g., a NAND flash interface) for processing a command and data between the controller 130 and the memory device 150. Specifically, the Memory I/F 142 may support data transfer between the controller 130 and the memory device 150. It is noted that the present invention is not limited to NAND flash memory/NAND flash interface, and that a suitable memory/storage interface may be selected depending upon the type of the memory device 150.

The memory 144 may serve as a working memory of the memory system 110 and the controller 130, and store data for driving the memory system 110 and the controller 130. The controller 130 may control the memory device 150 to perform read, write, program, and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation for checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
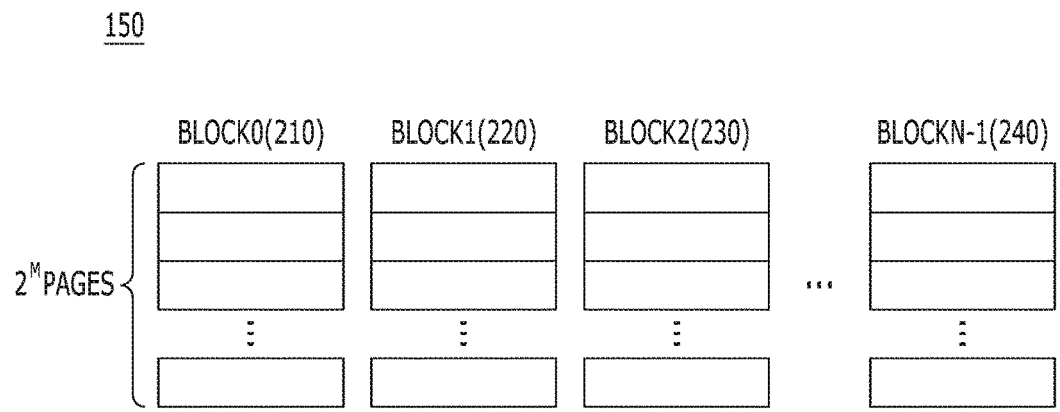
FIG. 2 is a schematic diagram illustrating an exemplary configuration of a memory device employed in the memory system shown in FIG. 1.

FIG. 2 is a schematic diagram illustrating the memory device 150 shown in FIG. 1.

Referring to FIG. 2, the memory device 150 may include a plurality of memory blocks 0 to N−1, and each of the memory blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, or a multi-level cell (MLC) storing 2- or more bit data. In an embodiment, the memory device 150 may include a plurality of triple level cells (TLC) each storing 3-bit data. In another embodiment, the memory device may include a plurality of quadruple level cells (QLC) each storing 4-bit level cell.

Figure 3:
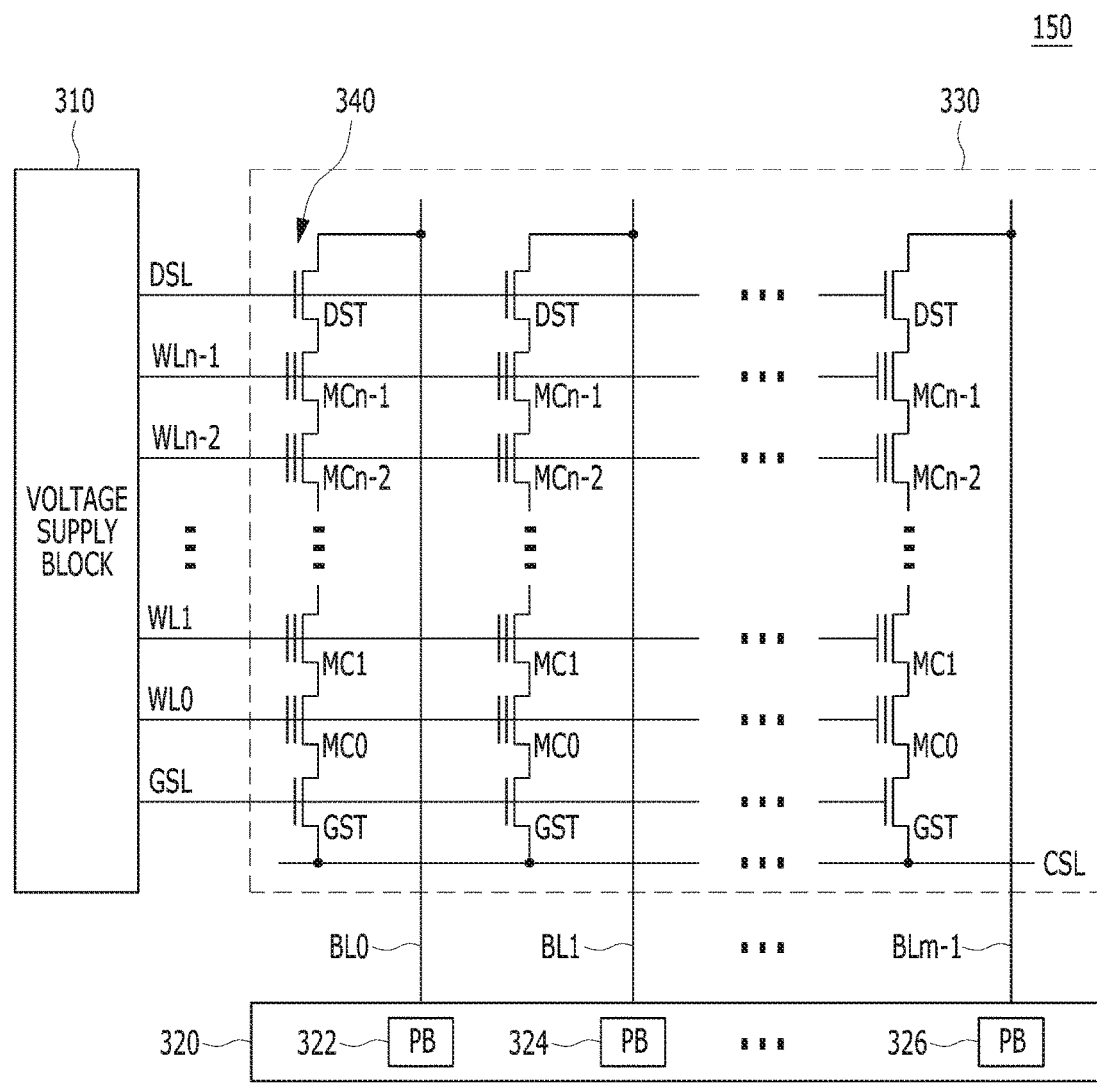
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150 shown in FIG. 2.

Referring to FIG. 3, a memory block 330, which may correspond to any of the plurality of memory blocks 152 to 156 (shown in FIG. 1) included in the memory device 150 of the memory system 110, may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, it is noted that the present invention is not limited thereto, and that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply block 310, which provides word line voltages including a program voltage, a read voltage, and a pass voltage to supply to the word lines according to an operation mode. The voltage generation operation of the voltage supply block 310 may be controlled by a control circuit (not illustrated). Under the control of the control circuit, the voltage supply block 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320, which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
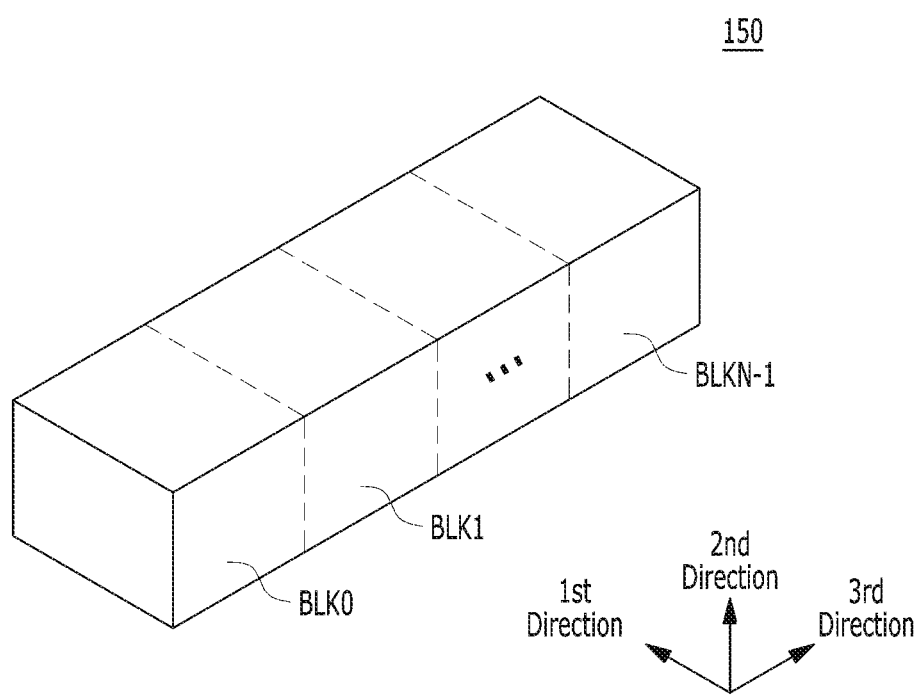
FIG. 4 is a schematic diagram illustrating an exemplary three-dimensional (3D) structure of the memory device shown in FIG. 2.

FIG. 4 is a schematic diagram illustrating an exemplary 3D structure of the memory device 150 shown in FIG. 2.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Hereinbelow, detailed descriptions will be made with reference to FIGS. 5 to 8, for data processing with respect to the memory device 150 in a memory system in accordance with an embodiment, particularly, a data processing operation in the case of performing a command operation corresponding to a command received from the host 102 and a data management operation.

Figure 5:
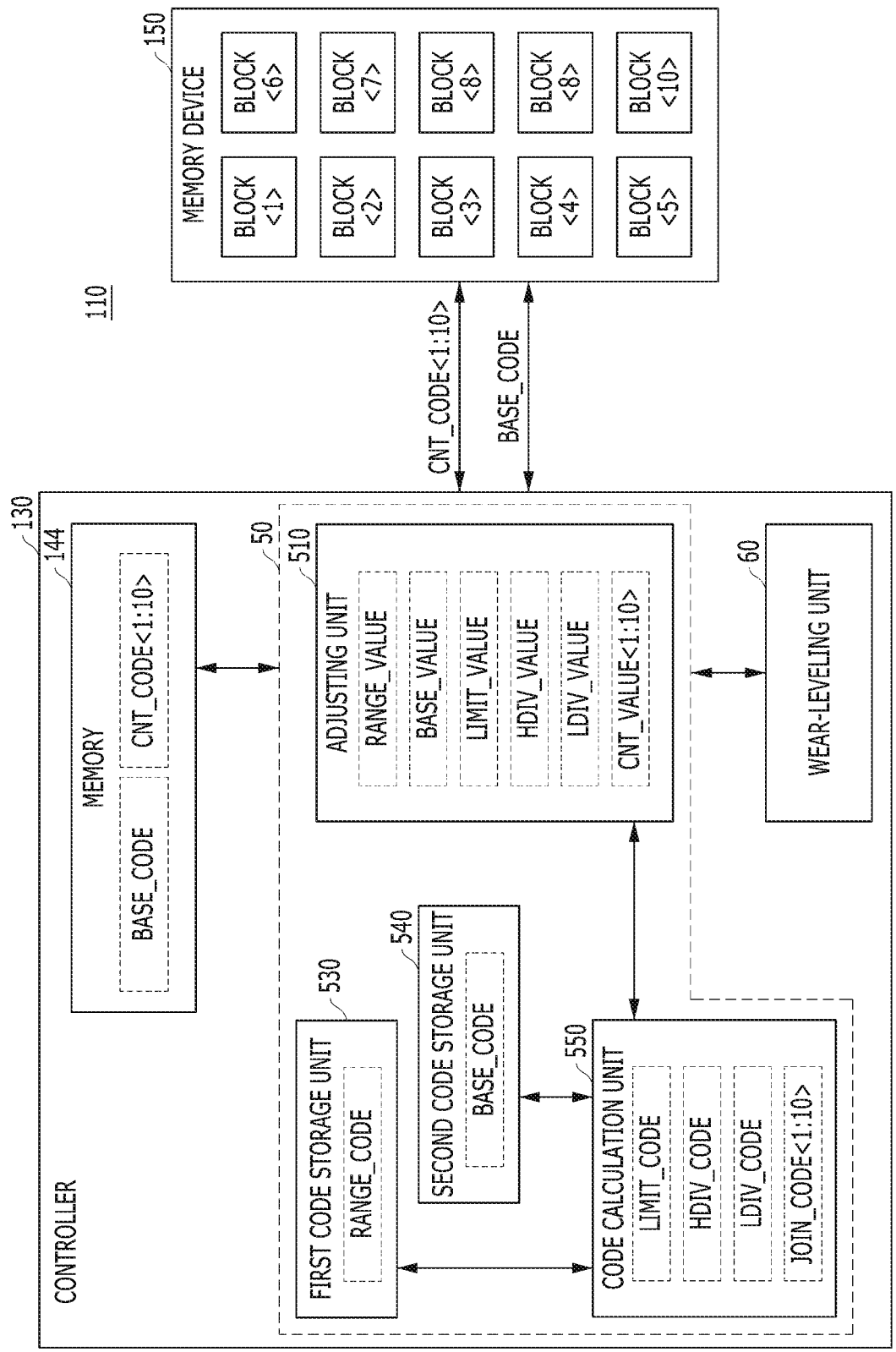
FIG. 5 is a block diagram illustrating a memory system in accordance with an embodiment of the present invention.

FIG. 5 is a block diagram illustrating the memory system 110 shown in FIG. 1.

Figure 6:
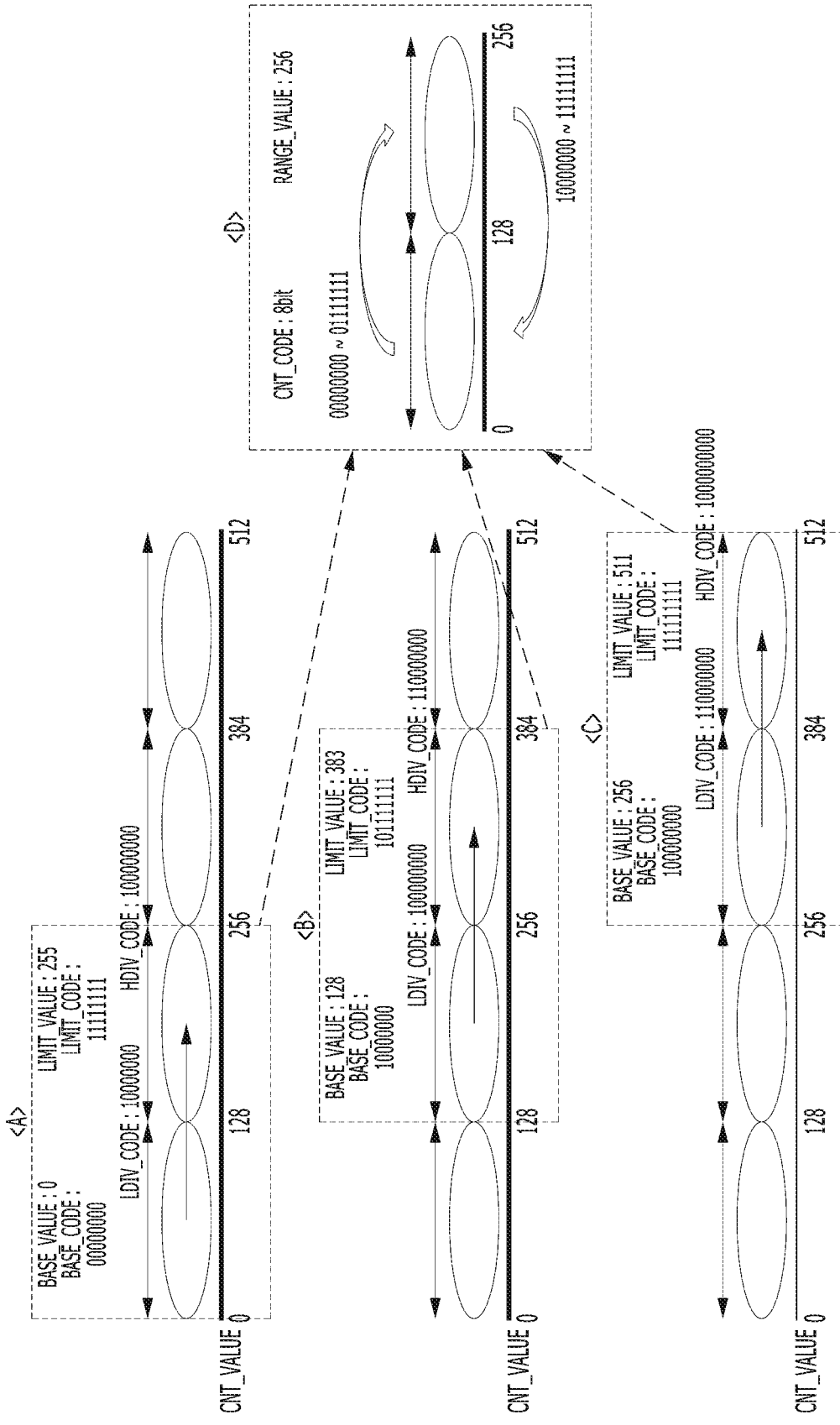
FIG. 6 is a diagram describing an operation of the memory system in accordance with the embodiment of FIG. 5.

FIG. 6 is a diagram for describing an operation of the memory system 110 shown in FIG. 1.

Referring to FIG. 5, the memory device 150 may have a nonvolatile characteristic, and may include a plurality of memory blocks BLOCK<1:10>. The controller 130 may include a counting management unit 50, a wear-leveling operation unit 60 and a memory 144. The counting management unit 50 may manage a plurality of counting values CNT_VALUE<1:10> corresponding to predetermined operations to the memory blocks BLOCK<1:10>, respectively, and the wear-leveling operation unit 60 may perform a wear-leveling operation to the memory blocks BLOCK<1:10>.

The counting management unit 50 may include an adjusting unit 510, a first code storage unit 530, a second code storage unit 540, and a code calculation unit 550.

The counting management unit 50 may be configured in hardware with circuits such as logic gates or transistors, or configured in software using the operation of the processor 134 of FIG. 1, or the software and hardware may be mixed. At this time, when the counting management unit 50 is configured in hardware, the components included in the counting management unit 50, that is, the adjusting unit 510, the first code storage 530, the second code storage unit 540 and the code calculation unit 550 may be physically implemented with circuits such as logical gates or transistors. Furthermore, when the counting management unit 50 is configured in software, each of the components included in the counting management unit 50, that is, the adjusting unit 510, the first code storage 530, the second code storage unit 540 and the code calculation unit 550 may be implemented through the operation of the processor 134. The implementation method of the counting management unit 50 may be decided according to a designer's selection.

The wear-leveling operation performed by the wear-leveling operation unit 60 may indicate an operation for controlling the memory blocks BLOCK<1:10> to be equally accessed in the memory device 150, thereby extending the lifetime of the memory device while preventing a performance reduction. During the wear-leveling operation, the wear-leveling operation unit 60 may equalize the erase counts or write counts of the memory blocks BLOCK<1:10>, such that the access frequencies of the memory blocks BLOCK<1:10> have an equal value.

The counting values CNT_VALUE<1:10> may be erase counting values CNT_VALUE<1:10> corresponding to a number of erase operations to the respective memory blocks BLOCK<1:10>. Furthermore, the counting values CNT_VALUE<1:10> may be write counting values CNT_VALUE<1:10> corresponding to a number of write operations to the respective memory blocks BLOCK<1:10>.

The counting management unit 50 may use count codes CNT_CODE of a preset range RANGE_VALUE between a limit value LIMIT_VALUE and a base value BASE_VALUE in order to manage the counting values CNT_VALUE<1:10>. The counting management unit 50 may manage the count codes CNT_CODE for each of the memory blocks BLOCK<1:10>. The counting management unit 50 may adjust values of the base value BASE_VALUE and the limit value LIMIT_VALUE by using the count code CNT_CODE of N-bit size in the form of a (N−1)-bit chain according to a distribution of the counting values CNT_VALUE<1:10>. Here, 'N' may represent any value of 2 to the powers of 'T', where T is an integer equal to or greater than 1.

For example, the counting management unit 50 may use 10 count codes CNT_CODE<1:10> to manage 10 counting values CNT_VALUE<1:10> for counting a number of the predetermined operations (i.e., a number of erase or write operations) performed to 10 memory blocks BLOCK<1:10>, respectively. The maximum number of predetermined operations that can be performed on each of the 10 memory blocks BLOCK<1:10> may be high, for example, 10^9. Thus, in order to simply count such a value in a binary manner, each of the count codes CNT_CODE<1:10> may require a size of 30 bits.

However, each of the count codes CNT_CODE may have a smaller size than the required size. For example, each of the count codes CNT_CODE may have a size of 8 bits representing maximum 256 number of the predetermined operations that can be performed on each of the 10 memory blocks BLOCK<1:10>. The maximum value of the respective count codes CNT_CODE may be the preset range RANGE_VALUE between the base value BASE_VALUE and the limit value LIMIT_VALUE.

Therefore, the counting management unit 50 may count the number of predetermined operations performed on each of the memory blocks BLOCK<1:10> by using the count codes CNT_CODE having N-bit size in the form of a (N−1)-bit chain and by adjusting the values of the base value BASE_VALUE and the limit value LIMIT_VALUE with fixed value of the preset range RANGE_VALUE. At this time, when the count code CNT_CODE has a value of a binary number, N may set to any one of 2 to the powers of T larger than 1.

Referring to FIGS. 5 and 6, when it is assumed that N is set to 8 (i.e., T=3), the count code CNT_CODE is an 8-bit code and the 8-bit count code CNT_CODE may be used in the form of a 7-bit chain. As described above, the maximum value of the count code CNT_CODE may be the preset range RANGE_VALUE between the base value BASE_VALUE and the limit value LIMIT_VALUE, and therefore the preset range RANGE_VALUE may be fixed to a range corresponding to a value of 256 (that is, 2^8). Therefore, when the base value BASE_VALUE and the limit value LIMIT_VALUE are repeatedly increased in the form of the 7-bit chain having a maximum value of 128 by increasing the count code CNT_CODE having the maximum value of 256 (i.e., the preset range RANGE_VALUE) from the base value BASE_VALUE of 0 to the limit value LIMIT_VALUE of 255 at the initial stage as illustrated in <A> of FIG. 6, by increasing the count code CNT_CODE from the base value BASE_VALUE of 128 to the limit value LIMIT_VALUE of 383 at the first chain as illustrated in <B> of FIG. 6, and increasing the count code CNT_CODE from the base value BASE_VALUE of 256 to the limit value LIMIT_VALUE of 511 at the second chain as illustrated in <C> of FIG. 6, the reference value BASE_VALUE and the limit value LIMIT_VALUE can be increased limitlessly through the 8-bit count code CNT_CODE as illustrated in <D> of FIG. 6.

This may indicate that the number of predetermined operations corresponding to the count code CNT_CODE between the base value BASE_VALUE and the limit value LIMIT_VALUE can be increased limitlessly. That is, since the count code CNT_CODE changes in the fixed range of the preset range RANGE_VALUE between changing values of the base value BASE_VALUE and the limit value LIMIT_VALUE, a value expressed through the count code CNT_CODE can be adjusted to any values, according to the changing values of the base value BASE_VALUE and the limit value LIMIT_VALUE with the fixed range of the preset range RANGE_VALUE therebetween. Therefore, no matter how high the maximum number of predetermined operations performed in each of the memory blocks BLOCK<1:10> is, the number of predetermined operations can be counted through the count code CNT_CODE.

The wear-leveling operation unit 60 may perform a wear-leveling operation on the memory blocks BLOCK<1:10> such that the counting values CNT_VALUE<1:10> are distributed to one of upper and lower half ranges of the preset range RANGE_VALUE in the range window having the value of the fixed preset range RANGE_VALUE between the change values of the base value BASE_VALUE and the limit value LIMIT_VALUE. FIG. 6 exemplifies an upper half range with an upper half value HDIV_CODE, and a lower half range with a lower half value LDIV_CODE in the preset range RANGE_VALUE.

For example, when it is assumed that the preset range RANGE_VALUE has a value of 256, N has a value of 8, the base value BASE_VALUE has an initial value of 0, and the limit value LIMIT_VALUE has an initial value of 255, the counting management unit 50 may perform a wear-leveling operation such that the counting values CNT_VALUE<1:10> corresponding to a number of the predetermined operations performed on the memory blocks BLOCK<1:10> are distributed in the lower half range of the preset range RANGE_VALUE between values 0 and 127, or the counting management unit 50 may perform a wear-leveling operation such that the counting values CNT_VALUE<1:10> are distributed in the upper half range of the preset range RANGE_VALUE between values 128 and 255.

In short, the counting management unit 50 in accordance with the present embodiment may manage the counting values CNT_VALUE<1:10> corresponding to a number of the predetermined operations performed to the memory blocks BLOCK<1:10> by using the count codes CNT_CODE<1:10> of the preset range RANGE_VALUE having smaller value size than the counting values CNT_VALUE<1:10>.

Referring to FIGS. 5 and 6, when the memory system 110 is powered to enter a booting period, the controller 130 may read values of a base code BASE_CODE, which corresponds to the base value BASE_VALUE, and the count codes CNT_CODE<1:10>, which correspond to the counting values CNT_VALUE<1:10>, from the memory device 150, and control the memory 144 to manage the read codes.

The controller 130 may store the values of the base code BASE_CODE and the count codes CNT_CODE<1:10> of the memory 144 into the memory device 150 randomly, repeatedly, at a predetermined point in time, or at an end of the memory system 110.

When the memory system 110 enters the booting period and the controller 130 loads the values of the count codes CNT_CODE<1:10> and the base code BASE_CODE into the memory 144, the counting management unit 50 may generate join codes JOIN_CODE<1:10> by summing the values of the base code BASE_CODE and the count codes CNT_CODE<1:10>. The join codes JOIN_CODE<1:10> may represent the current values of the counting values CNT_VALUE<1:10>.

Specifically, the counting management unit 50 may store the base code BASE_CODE of the memory 144 into the second code storage unit 540.

Then, the counting management unit 50 may store a value of a range code RANGE_CODE, a predetermined binary value of which is stored in a separate nonvolatile space such as ROM or a circuit such as a logic gate or transistor in the controller 130, in the first code storage unit 530. The range code RANGE_CODE may have a greater value than the maximum value of the count code CNT_CODE by an amount of 1. When the count code CNT_CODE has an N-bit size, the range code RANGE_CODE may have a (N+1)-bit size. At this time, M may be set to a natural number equal to or greater than 2. For example, when the count code CNT_CODE is an 8-bit code, the maximum binary value of the count code CNT_CODE is '1 1 1 1 1 1 1 1', the binary value of the range code RANGE_CODE may be '1 0 0 0 0 0 0 0 0', and the preset range RANGE_VALUE corresponding to the range code RANGE_CODE becomes '256'. For another example, when the count code CNT_CODE a 9-bit code, the maximum value of the count code CNT_CODE is '1 1 1 1 1 1 1 1 1', the range code RANGE_CODE becomes '1 0 0 0 0 0 0 0 0 0', and the preset range RANGE_VALUE corresponding to the range code RANGE_CODE becomes '512'.

The counting management unit 50 may control the code calculation unit 550 to calculate a value of a limit code LIMIT_CODE corresponding to the limit value LIMIT_VALUE, a value of the join codes JOIN_CODE<1:10> corresponding to the counting values CNT_VALUE<1:10>, a value of a lower half code LDIV_CODE larger than the base code BASE_CODE by a half value of the count code CNT_CODE, and a value of an upper half code HDIV_CODE larger than the lower half code LDIV_CODE by a half value of the count code CNT_CODE based on the range code RANGE_CODE of the first code storage unit 530, the base code BASE_CODE of the second code storage unit 540, and the count codes CNT_CODE<1:10> of the memory 144.

Specifically, the code calculation unit 550 may decide the value of the limit code LIMIT_CODE by summing the values of the range code RANGE_CODE and the base code BASE_CODE and subtracting a value of 1 from the summed values.

For example, when it is assumed that a binary value of the 8-bit base code BASE_CODE is '0 0 0 0 0 0 0 0' (i.e., the base value BASE_VALUE is '0') and a binary value of the 9-bit range code RANGE_CODE is '1 0 0 0 0 0 0 0 0' and a value of the preset range RANGE_VALUE is '256' as illustrated in <A> of FIG. 6, a binary value of the 8-bit limit code LIMIT_CODE may become '1 1 1 1 1 1 1 1', and the limit value LIMIT_VALUE may become '255'.

For another example, when it is assumed that a binary value of the 8-bit base code BASE_CODE is '1 0 0 0 0 0 0 0' (i.e., the base value BASE_VALUE is '128'), a binary value of the 9-bit range code RANGE_CODE is '1 0 0 0 0 0 0 0 0', and a value of the preset range RANGE_VALUE is '256' as illustrated in <B> of FIG. 6, a binary value of the 8-bit limit code LIMIT_CODE may become '1 0 1 1 1 1 1 1', and the limit value LIMIT_VALUE may become '383'.

For another example, when it is assumed that a binary value of the 8-bit base code BASE_CODE is '1 0 0 0 0 0 0 0' (i.e., the base value BASE_VALUE is '256') and a binary value of the 9-bit range code RANGE_CODE is '1 0 0 0 0 0 0 0 0' and a value of the preset range RANGE_VALUE is '256' as illustrated in <C> of FIG. 6, a binary value of the 8-bit limit code LIMIT_CODE may become '1 1 1 1 1 1 1 1', and the limit value LIMIT_VALUE may become '511'.

For yet another example, when it is assumed that a binary value of the 8-bit base code BASE_CODE is '1 0 0 0 0 0 0 0' (i.e., the base value BASE_VALUE is '256'), a binary value of the 9-bit range code RANGE_CODE is '1 0 0 0 0 0 0 0 0', and a value of the preset range RANGE_VALUE is '512', a binary value of the 8-bit limit code LIMIT_CODE may become '1 0 1 1 1 1 1 1 1', and the limit value LIMIT_VALUE may become '767'.

The code calculation unit 550 needs to calculate a half value of the N-bit count code CNT_CODE in order to calculate the lower half code LDIV_CODE larger than the base code BASE_CODE by a half value of the N-bit count code CNT_CODE and the upper half code HDIV_CODE larger than the lower half code LDIV_CODE by a half value of the N-bit count code CNT_CODE.

For example, when it is assumed that the count code CNT_CODE is an 8-bit code as illustrated in <D> of FIG. 6, the count code CNT_CODE has a maximum value of 256. Therefore, the half binary value of the 8-bit count code CNT_CODE is '1 0 0 0 0 0 0 0' corresponding to a value of 128.

For example, as illustrated in <A> of FIG. 6, when it is assumed that a binary value of the 8-bit base code BASE_CODE is set to '0 0 0 0 0 0 0 0' (i.e., the base value BASE_VALUE is '0') and the count code CNT_CODE is an 8-bit code having a maximum value of 256, the half value of the count code CNT_CODE is '1 0 0 0 0 0 0 0' corresponding to a value of 128, the lower half code LDIV_CODE is '1 0 0 0 0 0 0 0', and the upper half code HDIV_CODE is '1 0 0 0 0 0 0 0'. That is, a lower half value LDIV_VALUE corresponding to the lower half code LDIV_CODE becomes '128', and a high divided value HDIV_VALUE corresponding to the upper half code HDIV_CODE becomes '256'. The lower half value LDIV_VALUE of '128' may be obtained by adding the half value '128' of the 8-bit count code CNT_CODE to the base value BASE_VALUE of '0', and the upper divided value HDIV_VALUE of '256' may be obtained by adding the half value '128' of the 8-bit count code CNT_CODE to the lower half value LDIV_VALUE of '128'.

For another example, as illustrated in <B> of FIG. 6, when it is further assumed that a binary value of the base code BASE_CODE is set to '1 0 0 0 0 0 0 0' (i.e., the base value BASE_VALUE is '128'), the lower half code LDIV_CODE is '1 0 0 0 0 0 0 0 0', and the upper half code HDIV_CODE is '1 1 0 0 0 0 0 0'. That is, the lower half value LDIV_VALUE corresponding to the lower half code LDIV_CODE may become '256', and the high divided value HDIV_VALUE corresponding to the upper half code HDIV_CODE may become '384'. The lower half value LDIV_VALUE of '256' may be obtained by adding the half value '128' of the 8-bit count code CNT_CODE to the base value BASE_VALUE of '128', and the high divided value HDIV_VALUE of '384' may be obtained by adding the half value '128' of the 8-bit count code CNT_CODE to the lower half value LDIV_VALUE of '256'.

For another example, as illustrated in <C> of FIG. 6, when it is further assumed that a binary value of the base code BASE_CODE is '1 0 0 0 0 0 0 0' (i.e., the base value BASE_VALUE is '256'), the lower half code LDIV_CODE is '1 1 0 0 0 0 0 0', and the upper half code HDIV_CODE is '1 0 0 0 0 0 0 0 0'. That is, the lower half value LDIV_VALUE corresponding to the lower half code LDIV_CODE becomes '384', and the high divided value HDIV_VALUE corresponding to the upper half code HDIV_CODE becomes 512. The lower half value LDIV_VALUE of '384' may be obtained by adding the half value '128' of the 8-bit count code CNT_CODE to the base value BASE_VALUE of '256', and the high divided value HDIV_VALUE of '512' may be obtained by adding the half value '128' of the 8-bit count code CNT_CODE to the lower half value LDIV_VALUE of '384'.

The code calculation unit 550 may generate the join codes JOIN_CODE<1:10> by summing values of the base code BASE_CODE and the count codes CNT_CODE<1:10>. The join codes JOIN_CODE<1:10> may represent the current values of the counting values CNT_VALUE<1:10>. Each of the join codes JOIN_CODE<1:10> may have the same bit-size as or greater bit-size than the base code BASE_CODE.

For example, although not illustrated in the drawings, if the base code BASE_CODE is set to '1 1 0 0 0 0 0 0' of 9 bits (i.e., the base value BASE_VALUE is '384'), the limit code LIMIT_CODE is set to '1 0 0 1 1 1 1 1 1' because the limit value LIMIT_VALUE becomes '639' (that is, 384+256-1) according to the preset range RANGE_VALUE of '256', a binary value of the first count code CNT_CODE<1> of the count codes CNT_CODE<1:10> is '1 0 0 0 1 0 0 0' (corresponding to a value of 136), and a binary value of the second count code CNT_CODE is '0 0 0 0 1 0 0 0' (corresponding to a value of 8).

A binary value of the first join code JOIN_CODE<1> generated by summing the base code BASE_CODE and the first count code CNT_CODE<1> becomes '1 0 0 0 0 0 1 0 0 0', corresponding to a value of 520, that is, sum of 384 and 136, which are values of the base code BASE_CODE of '1 1 0 0 0 0 0 0' and the first count code CNT_CODE<1> of '1 0 0 0 1 0 0 0'.

A binary value of the second join code JOIN_CODE<2> generated by summing the base code BASE_CODE and the second count code CNT_CODE<2> becomes '1 1 0 0 0 1 0 0', corresponding to a value of 392, that is, sum of 384 and 4, which are values of the base code BASE_CODE of '1 1 0 0 0 0 0 0' and the second count code CNT_CODE<2> of '0 0 0 0 1 0 0 0'.

In the booting period, the adjusting unit 510 of the counting management unit 50 may change or keep the value of the base code BASE_CODE such that the join code JOIN_CODE corresponding to one having the minimum value among the counting values CNT_VALUE<1:10> is equal to or larger than the value of the base code BASE_CODE and is smaller than a value of the lower half code LDIV_CODE. When the value of the base code BASE_CODE is changed, the code calculation unit 550 of the counting management unit 50 may recalculate the lower half code LDIV_CODE based on the changed value of the base code BASE_CODE, and change the value of the limit code LIMIT_CODE by summing the range code RANGE_CODE to the changed base code BASE_CODE and subtracting 1 from the sum of the values.

For example, suppose that the base code BASE_CODE of '0 0 0 0 0 0 0 0' is stored in the memory 144 of the controller 130, and 10 8-bit count codes CNT_CODE<1:10> of '1 0 0 0 0 0 0 0', '1 0 0 0 0 0 1 0', '1 0 0 0 1 0 0 0', '1 0 0 1 0 0 0 1', '1 1 0 0 0 1 0 0', '1 0 0 0 0 0 1 0', '1 0 0 0 1 0 0 1', '1 1 1 0 0 0 0 0', '1 0 0 1 1 0 0 0', and '1 0 1 0 0 1 0 1' are stored in the memory 144, during the booting period. Thus, during the booting period, the range code RANGE_CODE of '1 0 0 0 0 0 0 0 0' may be stored in the first code storage unit 530 of the counting management unit 50, and the base code BASE_CODE of '0 0 0 0 0 0 0 0' may be stored in the second code storage unit 540. The lower half code LDIV_CODE may be calculated as '1 0 0 0 0 0 0 0' through the code calculation unit 550, and the limit code LIMIT_CODE may be calculated as '1 1 1 1 1 1 1 1' through the code calculation unit 550. 10 join codes JOIN_CODE<1:10> may be calculated as '1 0 0 0 0 0 0 0', '1 0 0 0 0 0 1 0', '1 0 0 0 1 0 0 0', '1 0 0 1 0 0 0 1', '1 1 0 0 0 1 0 0', '1 0 0 0 0 0 1 0', '1 0 0 0 1 0 0 1', '1 1 1 0 0 0 0 0', '1 0 0 1 1 0 0 0', and '1 0 1 0 0 1 0 1', respectively, through the code calculation unit 550.

In this state, the adjusting unit 510 of the counting management unit 50 may check whether the join code corresponding to the minimum value among the 10 join codes JOIN_CODE<1:10>, that is, the first join code JOIN_CODE<1> is equal to or larger than the based code BASE_CODE, and smaller than the lower half code LDIV_CODE. As a result, although the first join code JOIN_CODE<1> is larger than the base code BASE_CODE of '0 0 0 0 0 0 0 0' because the first join code JOIN_CODE<1> is '1 0 0 0 0 0 0 0', the base code BASE_CODE is equal to the lower half code LDIV_CODE of '1 0 0 0 0 0 0 0', which means that the base code BASE_CODE is not smaller than the lower half code LDIV_CODE.

Therefore, the adjusting unit 510 of the counting management unit 50 may reset the base code BASE_CODE to the lower half code LDIV_CODE, and the code calculation unit 550 may recalculate the lower half code LDIV_CODE using the reset based code BASE_CODE. That is, the base code BASE_CODE which was '0 0 0 0 0 0 0 0' at the start point of the booting period may be reset to '1 0 0 0 0 0 0 0', the lower half code LDIV_CODE may be recalculated and reset to '1 0 0 0 0 0 0 0 0' based on the reset base code BASE_CODE of '1 0 0 0 0 0 0 0', and '1 0 1 1 1 1 1 1' which is obtained by adding the range code RANGE_CODE of '1 0 0 0 0 0 0 0' to the reset base code BASE_CODE of '1 0 0 0 0 0 0 0' and subtracting 1 from the added value may be reset to the limit code LIMIT_CODE.

For another example, suppose that the base code BASE_CODE of '1 0 0 0 0 0 0 0' is stored in the memory 144 of the controller 130, and 10 8-bit count codes CNT_CODE<1:10> of '0 0 0 0 0 0 0 0', '0 0 0 0 0 0 1 0', '0 0 0 0 1 0 0 0', '0 0 0 1 0 0 0 1', '0 1 0 0 0 1 0 0', '0 0 0 0 0 0 1 0', '0 0 0 0 1 0 0 1', '0 1 1 0 0 0 0 0', '0 0 0 1 1 0 0 0', and '0 0 1 0 0 1 0 1' are stored in the memory 144, during the booting period. Thus, during the booting period, the range code RANGE_CODE of '1 0 0 0 0 0 0 0' may be stored in the first code storage unit 530 of the counting management unit 50, and the base code BASE_CODE of '1 0 0 0 0 0 0 0' may be stored in the second code storage unit 540.

The lower half code LDIV_CODE is calculated as '1 0 0 0 0 0 0 0' through the code calculation unit 550, and the limit code LIMIT_CODE may be calculated as '1 0 1 1 1 1 1 1' through the code calculation unit 550. 10 join codes JOIN_CODE<1:10> may be calculated as '1 0 0 0 0 0 0 0', '1 0 0 0 0 0 1 0', '1 0 0 0 1 0 0 0', '1 0 0 1 0 0 0 1', '1 1 0 0 0 1 0 0', '1 0 0 0 0 0 1 0', '1 0 0 0 1 0 0 1', '1 1 1 0 0 0 0 0', '1 0 0 1 1 0 0 0' and '1 0 1 0 0 1 0 1' through the code calculation unit 550.

In this state, the adjusting unit 510 of the counting management unit 50 may check whether the join code corresponding to the minimum value among the 10 join codes JOIN_CODE<1:10>, that is, the first join code JOIN_CODE<1> is equal to or larger than the based code BASE_CODE, and smaller than the lower half code LDIV_CODE. As a result, since the first join code JOIN_CODE<1> is '1 0 0 0 0 0 0 0', the first join code JOIN_CODE<1> is equal to the base code BASE_CODE of '1 0 0 0 0 0 0 0', which means that the join code JOIN_CODE<1> is equal to the base code BASE_CODE and smaller than the lower half code LDIV_CODE of '1 0 0 0 0 0 0 0'.

Therefore, the adjusting unit 510 of the counting management unit 50 may retain the base code BASE_CODE of '1 0 0 0 0 0 0 0', the lower half code LDIV_CODE of '1 0 0 0 0 0 0 0', and the limit code LIMIT_CODE of '1 0 1 1 1 1 1 1', which have been decided when the booting period started.

As described in the above two examples, the 10 count codes CNT_CODE<1:10> of 1 0 0 0 0 0 0 0', '1 0 0 0 0 0 1 0', '1 0 0 0 1 0 0 0', '1 0 0 1 0 0 0 1', '1 1 0 0 0 1 0 0', '1 0 0 0 0 0 1 0', '1 0 0 0 1 0 0 1', '1 1 1 0 0 0 0 0', '1 0 0 1 1 0 0 0', and '1 0 1 0 0 1 0 1' with the base code BASE_CODE set to '0 0 0 0 0 0 0 0', and the 10 count codes CNT_CODE<1:10> of '0 0 0 0 0 0 0 0', '0 0 0 0 0 0 1 0', '0 0 0 0 1 0 0 0', '0 0 0 1 0 0 0 1', '0 1 0 0 0 1 0 0', '0 0 0 0 0 0 1 0', '0 0 0 0 1 0 0 1', '0 1 1 0 0 0 0 0', '0 0 0 1 1 0 0 0', and '0 0 1 0 0 1 0 1' with the base code BASE_CODE set to '1 0 0 0 0 0 0 0' may all indicate the join codes JOIN_CODE<1:10> of '1 0 0 0 0 0 0 0', '1 0 0 0 0 0 1 0', '1 0 0 0 1 0 0 0', '1 0 0 1 0 0 0 1', '1 1 0 0 0 1 0 0', '1 0 0 0 0 0 1 0', '1 0 0 0 1 0 0 1', '1 1 1 0 0 0 0 0', '1 0 0 1 1 0 0 0', and '1 0 1 0 0 1 0 1'. That is, although the count codes CNT_CODE<1:10> have different values, the join codes JOIN_CODE<1:10> may have the same values according to the value of the base code BASE_CODE. In the present embodiment, the values indicated by the count codes CNT_CODE<1:10> can be increased limitlessly through an operation of adjusting the value of the base code BASE_CODE, based on the above-described principles.

Then, when entering the wear-leveling period after the booting period, the adjusting unit 510 of the counting management unit 50 may transfer information to the wear-leveling operation unit 60, the information indicating whether the join code corresponding to the maximum value of the counting values CNT_VALUE<1:10> is smaller than the lower half code LDIV_CODE. Thus, the state in which the join code corresponding to the maximum value of the counting values CNT_VALUE<1:10> is smaller than the lower half code LDIV_CODE can be retained through the wear-leveling operation on the memory blocks BLOCK<1:10>, performed by the wear-leveling operation unit 60.

Although the wear-leveling operation unit 60 performs a wear-leveling operation on the memory blocks BLOCK<1:10> whenever entering the wear-leveling period after the booting period, the join code corresponding to the maximum value of the counting values CNT_VALUE<1:10> inevitably exceeds the lower half code LDIV_CODE at a certain point, while predetermined operations are continuously performed to the respective memory blocks BLOCK<1:10> with time.

Therefore, when entering the wear-leveling period, the adjusting unit 510 of the counting management unit 50 may check whether the join code corresponding to the maximum value of the counting values CNT_VALUE<1:10> exceeds the lower half code LDIV_CODE. Based on the check result, the adjusting unit 510 may cause the wear-leveling operation unit 60 to perform a wear-leveling operation on the memory blocks BLOCK<1:10> such that the join code corresponding to the maximum value of the counting values CNT_VALUE<1:10> can be retained at a smaller value than the lower half code LDIV_CODE, or cause the wear-leveling operation unit 60 to perform a wear-leveling operation on the memory blocks BLOCK<1:10> such that the join code corresponding to the minimum value of the counting values CNT_VALUE<1:10> becomes equal to or larger than the lower half code LDIV_CODE and the join code corresponding to maximum value of the counting values CNT_VALUE<1:10> becomes smaller than the upper half code HDIV_CODE.

That is, the adjusting unit 510 of the counting management unit 50 may check whether the join code corresponding to the maximum value of the counting values CNT_VALUE<1:10> is equal to or larger than the lower half code LDIV_CODE in the wear-leveling period. When the check result indicates that the join code corresponding to the maximum value of the counting values CNT_VALUE<1:10> does not exceed the lower half code LDIV_CODE, the adjusting unit 510 may induce the wear-leveling operation of the wear-leveling operation unit 60 to continuously maintain the state in which the join code does not exceed the lower half code LDIV_CODE. However, when the check result indicates that the join code corresponding to the maximum value of the counting values CNT_VALUE<1:10> has exceeded the lower half code LDIV_CODE, the adjusting unit 510 may cause the wear-leveling operation of the wear-leveling operation unit 60 such that the join code corresponding to the minimum value of the counting values CNT_VALUE<1:10> becomes equal to or larger than the lower half code LDIV_CODE and the join code corresponding to the maximum value of the counting values CNT_VALUE<1:10> becomes smaller than the upper half code HDIV_CODE.

Furthermore, after causing the wear-leveling operation of the wear-leveling operation unit 60 such that the join code corresponding to the minimum value of the counting values CNT_VALUE<1:10> becomes equal to or larger than the lower half code LDIV_CODE and the join code corresponding to the maximum value of the counting values CNT_VALUE<1:10> becomes smaller than the upper half code HDIV_CODE, the adjusting unit 510 of the counting management unit 50 may check that the join code corresponding to the minimum value of the counting values CNT_VALUE<1:10> is actually equal to or larger than the lower half code LDIV_CODE. When the check result indicates that the join code corresponding to the minimum value of the counting values CNT_VALUE<1:10> is not yet equal to or larger than the lower half code LDIV_CODE, the adjusting unit 510 may continuously cause the wear-leveling operation of the wear-leveling operation unit 60 such that the join code corresponding to the minimum value of the counting values CNT_VALUE<1:10> becomes equal to or larger than the lower half code LDIV_CODE and the join code corresponding to the maximum value of the counting values CNT_VALUE<1:10> becomes smaller than the upper half code HDIV_CODE. However, when the check result indicates that the join code corresponding to the minimum value of the counting values CNT_VALUE<1:10> is equal to or larger than the lower half code LDIV_CODE, the adjusting unit 510 may reset the lower half code LDIV_CODE to the base code BASE_CODE, and the code calculation unit 550 may reset the lower half code LDIV_CODE, the limit code LIMIT_CODE and the upper half code HDIV_CODE, using the base code BASE_CODE reset by the adjusting unit 510.

For example, suppose that the base code BASE_CODE is set to '1 0 0 0 0 0 0 0', the lower half code LDIV_CODE is set to '1 0 0 0 0 0 0 0 0', the limit code LIMIT_CODE is set to '1 0 1 1 1 1 1 1 1', and the upper half code HDIV_CODE is set to '1 1 0 0 0 0 0 0 0', during the booting period.

At this time, the values of the 10 join codes JOIN_CODE<1:10> may not decrease but only increase, when the predetermined operations for the respective memory blocks BLOCK<1:10> are performed. Therefore, when entering the wear-leveling period after the booting period, the wear-leveling operation unit 60 may perform a wear-leveling operation on the memory blocks BLOCK<1:10> such that the values of the 10 join codes JOIN_CODE<1:10> become equal to each other. At this time, the adjusting unit 510 of the counting management unit 50 may cause the wear-leveling operation 60 to perform the wear-level operation on the memory blocks BLOCK<1:10>, such that the maximum value of the join codes JOIN_CODE<1:10> can be retained at a smaller value than the lower half code LDIV_CODE of '1 0 0 0 0 0 0 0 0'.

In this way, the wear-leveling operation unit 60 performs a wear-leveling operation on the memory blocks BLOCK<1:10> such that the values of the 10 join codes JOIN_CODE<1:10> are equalized, but the values of the 10 join codes JOIN_CODE<1:10> only increases. Therefore, the maximum value of the join codes JOIN_CODE<1:10> inevitably exceeds the lower half code LDIV_CODE of '1 0 0 0 0 0 0 0 0' at a certain point.

Therefore, the adjusting unit 510 of the counting management unit 50 may check whether the maximum value of the join codes JOIN_CODE<1:10> exceeds the lower half code LDIV_CODE of '1 0 0 0 0 0 0 0 0' during the wear-leveling operation for the memory blocks BLOCK<1:10> by the wear-leveling operation unit 60. When the check result indicates that the join code corresponding to the maximum value of the counting values CNT_VALUE<1:10> does not exceed the lower half code LDIV_CODE of '1 0 0 0 0 0 0 0 0', the adjusting unit 510 may cause the wear-leveling operation of the wear-leveling operation unit 60 to maintain the state in which the join code does not exceed the lower half code LDIV_CODE. However, when the check result indicates that the join code corresponding to the maximum value of the counting values CNT_VALUE<1:10> has exceeded the lower half code LDIV_CODE of '1 0 0 0 0 0 0 0 0', the adjusting unit 510 may cause the wear-leveling operation of the wear-leveling operation unit 60 such that the join code corresponding to the minimum value of the counting values CNT_VALUE<1:10> becomes equal to or larger than the lower half code LDIV_CODE of '1 0 0 0 0 0 0 0 0' and the join code corresponding to the maximum value of the counting values CNT_VALUE<1:10> becomes smaller than the upper half code HDIV_CODE of '1 1 0 0 0 0 0 0 0'.

Furthermore, after causing the wear-leveling operation of the wear-leveling operation unit 60 such that the join code corresponding to the minimum value of the counting values CNT_VALUE<1:10> becomes equal to or larger than the lower half code LDIV_CODE of '1 0 0 0 0 0 0 0 0' and the join code corresponding to the maximum value of the counting values CNT_VALUE<1:10> becomes smaller than the upper half code HDIV_CODE of '1 1 0 0 0 0 0 0 0', the adjusting unit 510 of the counting management unit 50 may check whether the join code corresponding to the minimum value of the counting values CNT_VALUE<1:10> is actually equal to or larger than the lower half code LDIV_CODE of '1 0 0 0 0 0 0 0 0'. When the check result indicates that the join code corresponding to the minimum value of the counting values CNT_VALUE<1:10> is not yet equal to or larger than the lower half code LDIV_CODE of '1 0 0 0 0 0 0 0 0', the adjusting unit 510 may continuously cause the wear-leveling operation of the wear-leveling operation unit 60 such that the join code corresponding to the minimum value of the counting values CNT_VALUE<1:10> becomes equal to or larger than the lower half code LDIV_CODE of '1 0 0 0 0 0 0 0 0' and the join code corresponding to the maximum value of the counting values CNT_VALUE<1:10> becomes smaller than the upper half code HDIV_CODE of '1 1 0 0 0 0 0 0 0'. However, when the check result indicates that the join code corresponding to the minimum value of the counting values CNT_VALUE<1:10> is equal to or larger than the lower half code LDIV_CODE of '1 0 0 0 0 0 0 0 0', the adjusting unit 510 may reset the reset code BASE_CODE, which has been set to '1 0 0 0 0 0 0 0' in the booting period, to '1 0 0 0 0 0 0 0 0' corresponding to the lower half code LDIV_CODE; the code calculation unit 550 may reset the lower half code LDIV_CODE, which has been set to '1 0 0 0 0 0 0 0 0' in the booting period, to '1 1 0 0 0 0 0 0 0'; reset the limit code LIMIT_CODE, which has been set to '1 0 1 1 1 1 1 1 1' in the booting period, to '1 1 1 1 1 1 1 1 1'; and reset the upper half code HDIV_CODE, which has been set to '1 1 0 0 0 0 0 0 0' in the booting period, to '1 0 0 0 0 0 0 0 0', using the base code BASE_CODE reset to '1 0 0 0 0 0 0 0 0' by the adjusting unit 510.

As described above, the memory system in accordance with the present embodiment may control the memory blocks BLOCK<1:10> through the wear-leveling operation for the memory blocks BLOCK<1:10> such that the counting values corresponding to a number of the predetermined operations performed to the memory blocks BLOCK<1:10> are distributed within the preset range RANGE_VALUE. Then, the memory system may manage the counting values CNT_VALUE<1:10> for the predetermined operations to the memory blocks BLOCK<1:10>, using the count codes CNT_CODE in the form of a chain, through which only the values corresponding to the preset range RANGE_VALUE can be counted.

Through this operation, the counting values for the predetermined operations may be managed infinitely through the count code CNT_CODE having a relatively small number of bits through which a relatively small value can be counted.

Furthermore, since the size of the count code CNT_CODE is relatively small, the memory space used to store the count code CNT_CODE can be significantly reduced.

For example, when it is assumed that the memory device 150 includes 1,000 memory blocks (not illustrated) and a 30-bit count code is required to simply count the number of predetermined operations to one memory block in a binary manner, 30*1,000 bits may be needed to simply count the numbers of predetermined operations to the 1,000 memory blocks in a binary manner. In the present embodiment, however, when it is assumed that an 8-bit count code is needed in order to count the number of predetermined operations for one memory block, only 8*1,000 bits may be needed to simply count the numbers of predetermined operations to the 1,000 memory blocks in a binary manner.

FIGS. 5 and 6 exemplify a counting window of the preset range RANGE_VALUE having lower and upper half ranges or two sub-ranges, which will not limit the scope of the present invention. The number of sub-ranges of the preset range RANGE_VALUE may vary according to system design.

FIGS. 7 to 15 are diagrams schematically illustrating exemplary applications of the data processing system of FIG. 1.

Figure 7:
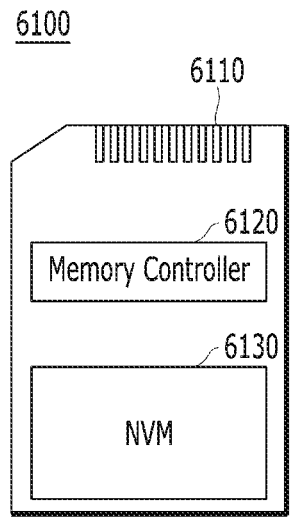
FIGS. 7 to 15 are diagrams schematically illustrating exemplary applications of the data processing system shown in FIG. 1 in accordance with various embodiments of the present invention.

FIG. 7 is a diagram schematically illustrating an example of the data processing system including the memory system in accordance with the present embodiment. FIG. 7 schematically illustrates a memory card system to which the memory system in accordance with the present embodiment is applied.

Referring to FIG. 7, the memory card system 6100 may include a memory controller 6120, a memory device 6130, and a connector 6110.

More specifically, the memory controller 6120 may be connected to the memory device 6130 embodied by a nonvolatile memory, and may access the memory device 6130. For example, the memory controller 6120 may control read, write, erase, and background operations of the memory device 6130. The memory controller 6120 may o provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface, and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI, and Bluetooth. Thus, the memory system and the data processing system in accordance with the present embodiment may be applied to wired/wireless electronic devices or mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC), and a universal flash storage (UFS).

Figure 8:
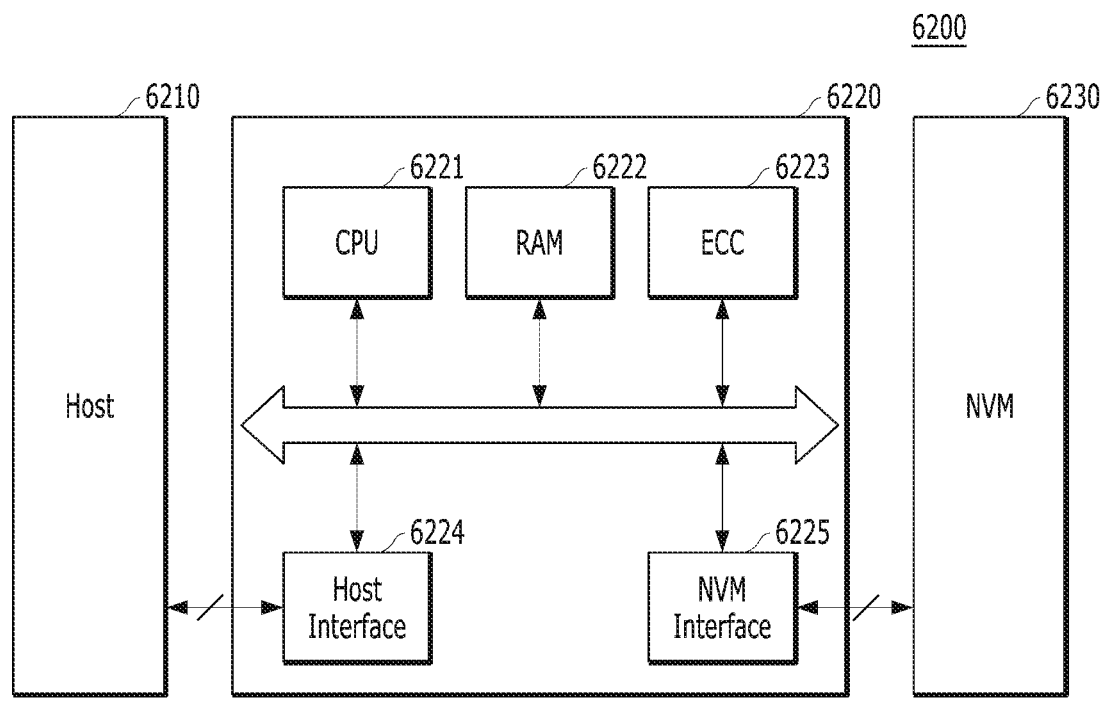

FIG. 8 is a diagram schematically illustrating another example of the data processing system including the memory system in accordance with the present embodiment.

Referring to FIG. 8, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224, and a memory interface such as an NVM interface 6225.

The CPU 6221 may control overall operations on the memory device 6230 such as read, write, file system management, and bad page management operations. The RAM 6222 may be operated according to control of the CPU 6221, and used as a work memory, buffer memory, or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC, or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe, or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 may communicate with the external device through one or more of various communication protocols, the memory system and the data processing system in accordance with the present embodiment may be applied to wired/wireless electronic devices or particularly a mobile electronic device.

Figure 9:
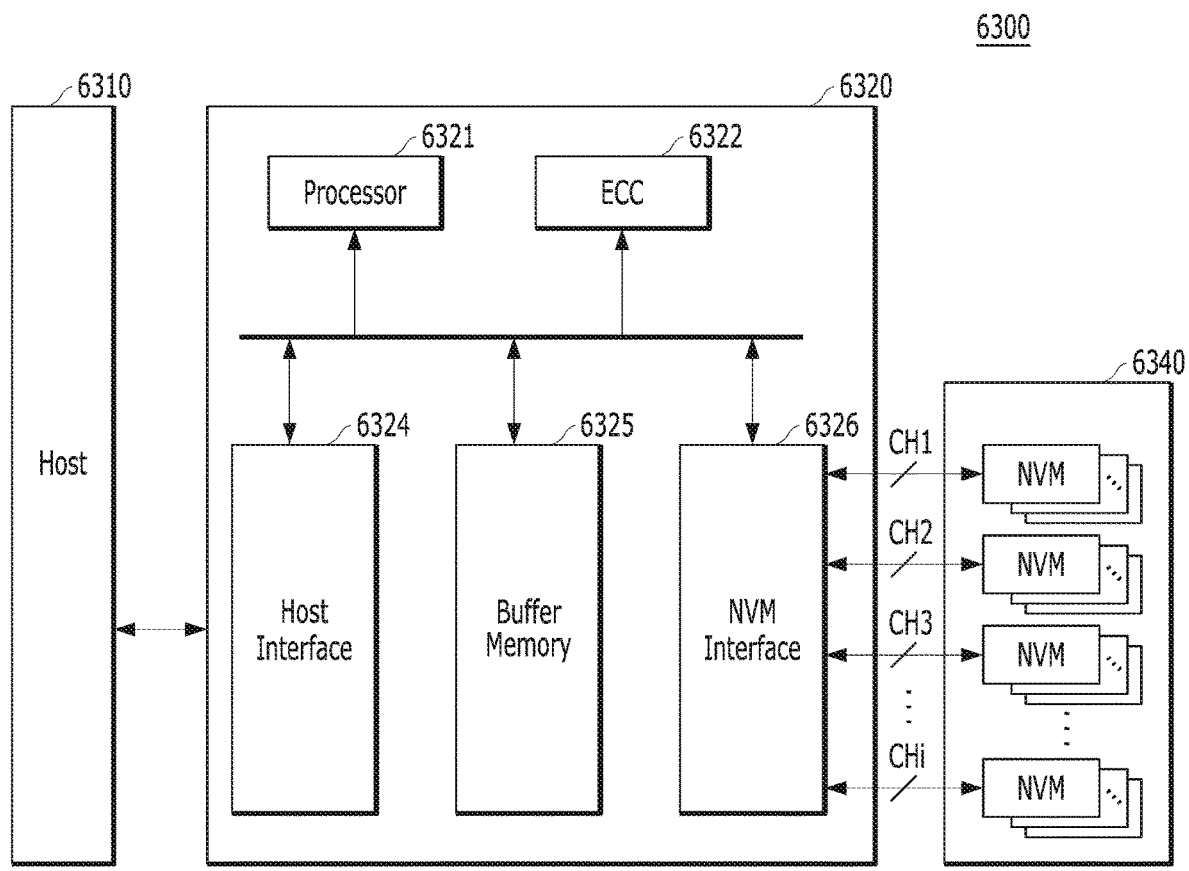

FIG. 9 is a diagram schematically illustrating another example of the data processing system including the memory system in accordance with an embodiment of the present invention. FIG. 9 schematically illustrates an SSD to which the memory system in accordance with the present embodiment is applied.

Referring to FIG. 9, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324, and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM, and GRAM or nonvolatile memories such as FRAM, ReRAM, STT-MRAM, and PRAM. For convenience of description, FIG. 8 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, Redundant Array of Independent Disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 10:
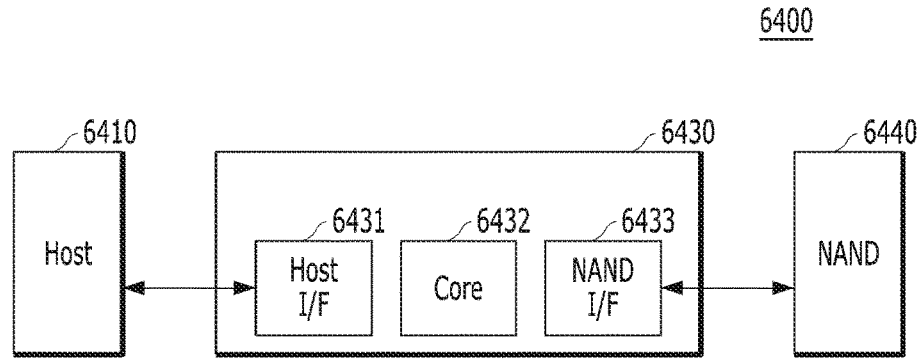

FIG. 10 is a diagram schematically illustrating another example of the data processing system including the memory system in accordance an embodiment of the present invention. FIG. 10 schematically illustrates an embedded Multi-Media Card (eMMC) to which the memory system in accordance with the present embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS-I/UHS-II) interface.

FIGS. 11 to 14 are diagrams schematically illustrating other examples of the data processing system including the memory system in accordance with an embodiment of the present invention. FIGS. 11 to 14 schematically illustrate Universal Flash Storage (UFS) systems to which the memory system in accordance with the present embodiment is applied.

Referring to FIGS. 11 to 14, the UFS systems 6500, 6600, 6700, and 6800 may include hosts 6510, 6610, 6710, and 6810, UFS devices 6520, 6620, 6720, and 6820, and UFS cards 6530, 6630, 6730, and 6830, respectively. The hosts 6510, 6610, 6710, and 6810 may serve as application processors of wired/wireless electronic devices or particularly mobile electronic devices, the UFS devices 6520, 6620, 6720, and 6820 may serve as embedded UFS devices, and the UFS cards 6530, 6630, 6730, and 6830 may serve as external embedded UFS devices or removable UFS cards.

The hosts 6510, 6610, 6710, and 6810, the UFS devices 6520, 6620, 6720, and 6820, and the UFS cards 6530, 6630, 6730, and 6830 in the respective UFS systems 6500, 6600, 6700, and 6800 may communicate with external devices, for example, wired/wireless electronic devices or mobile electronic devices through UFS protocols, and the UFS devices 6520, 6620, 6720, and 6820 and the UFS cards 6530, 6630, 6730, and 6830 may be embodied by the memory system 110 illustrated in FIGS. 1 and 5. For example, in the UFS systems 6500, 6600, 6700, and 6800, the UFS devices 6520, 6620, 6720, and 6820 may be embodied in the form of the data processing system 6200, the SSD 6300 or the eMMC 6400 described with reference to FIGS. 8 to 10, and the UFS cards 6530, 6630, 6730, and 6830 may be embodied in the form of the memory card system 6100 described with reference to FIG. 7.

Furthermore, in the UFS systems 6500, 6600, 6700, and 6800, the hosts 6510, 6610, 6710, and 6810, the UFS devices 6520, 6620, 6720, and 6820, and the UFS cards 6530, 6630, 6730, and 6830 may communicate with each other through an UFS interface, for example, Unified Protocol (MIPI M-PHY and MIPI UniPro) in Mobile Industry Processor Interface (MIPI). Furthermore, the UFS devices 6520, 6620, 6720, and 6820 and the UFS cards 6530, 6630, 6730, and 6830 may communicate with each other through various protocols other than the UFS protocol, for example, UFDs, MMC, SD, mini-SD, and micro-SD.

Figure 11:
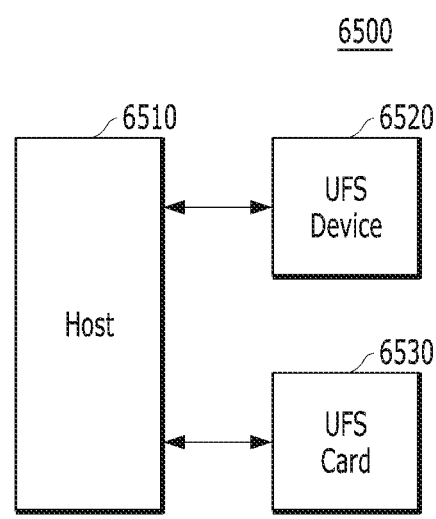

In the UFS system 6500 illustrated in FIG. 11, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 12:
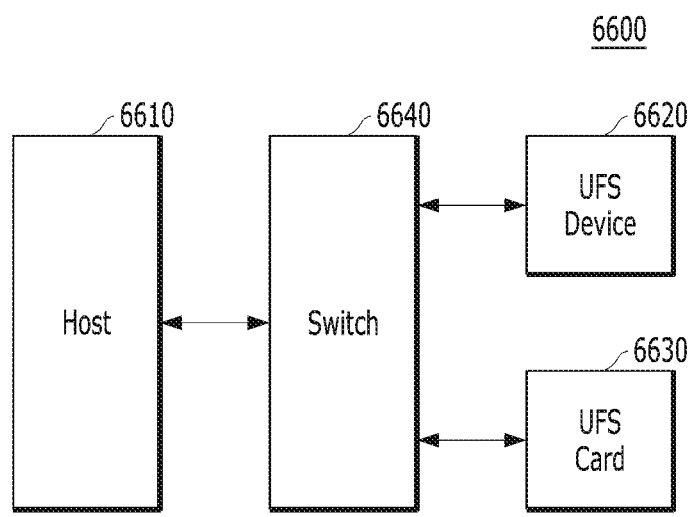

In the UFS system 6600 illustrated in FIG. 12, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 13:
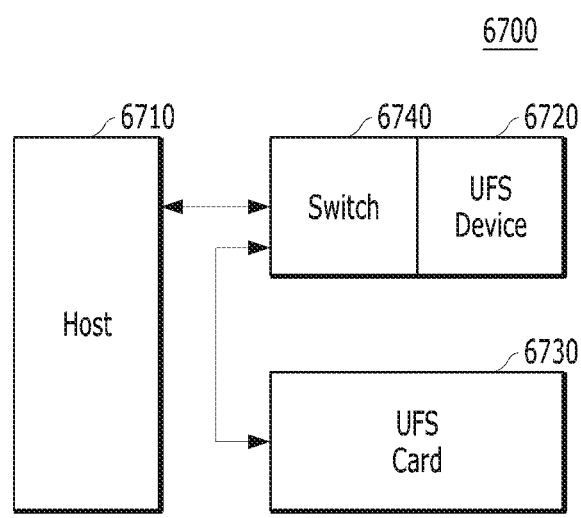

In the UFS system 6700 illustrated in FIG. 13, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 14:
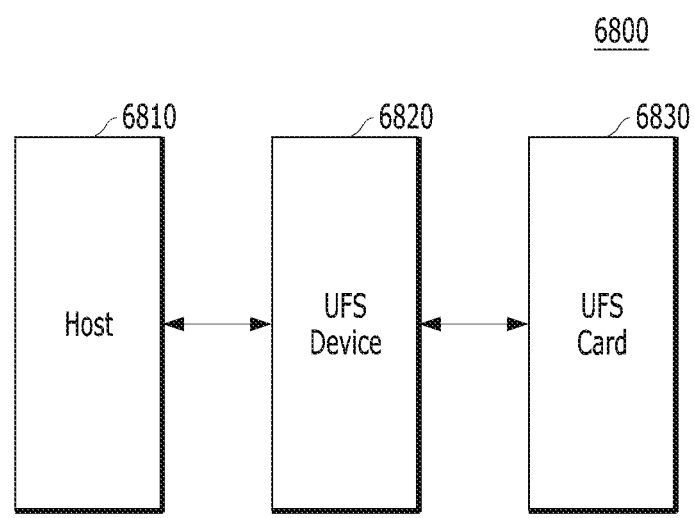

In the UFS system 6800 illustrated in FIG. 14, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 15:
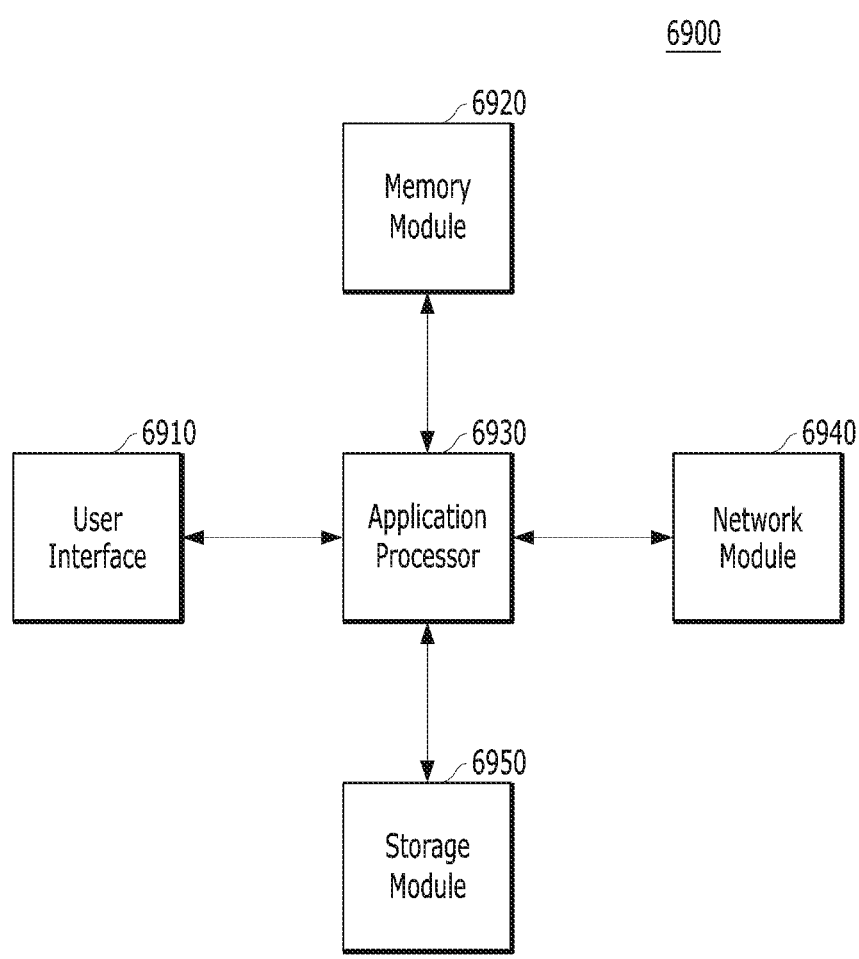

FIG. 15 is a diagram schematically illustrating another example of the data processing system including the memory system in accordance with an embodiment of the present invention. FIG. 15 is a diagram schematically illustrating a user system to which the memory system in accordance with the present embodiment is applied.

Referring to FIG. 15, the user system 6900 may include an application processor 6930, a memory module 6920, a network module 6940, a storage module 6950, and a user interface 6910.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory, or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM, or LPDDR3 SDRAM, or a nonvolatile RAM such as PRAM, ReRAM, MRAM, or FRAM. For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash, and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor, and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations to the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In accordance with the present embodiments, the memory system and the operating method thereof may control the plurality of memory blocks such that the counting values corresponding to a number of the predetermined operations performed to the respective memory blocks are distributed within the preset range through the wear-leveling operation for the plurality of memory blocks. Then, the memory system and the operating method thereof may manage the counting values corresponding to a number of the predetermined operations performed to the respective memory blocks using the count code in the form of a chain, the count code capable of counting only values corresponding to the preset range.

Through the operation, the counting values for the predetermined operations may be managed infinitely through the count code having a relatively small number of bits through which a relatively small value can be counted.

Furthermore, since the size of the count code is relatively small, the memory space used to store the count code can be significantly reduced.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
    a nonvolatile memory device comprising K memory blocks; and
    a controller suitable for controlling an operation of the nonvolatile memory device,
    wherein the controller comprises:
    a processor suitable for using K count codes, each having an N-bit size, and representing numbers of times select operations are performed on the K memory blocks respectively, wherein the K count codes manage K counting values representing added numbers of the select operations performed on the K memory blocks, respectively, each of the K counting values having a set range defined by a base value and a limit value, which are different for each of the K counting values, and the set range for each counting value overlapping the set range of at least one other counting value of the K counting values, and adjusting the base value and the limit value of a select counting value by using the corresponding count code in the form of a (N−1)-bit chain depending on a distribution of the K counting values; and
    wherein the controller is suitable for performing a wear-leveling operation on the K memory blocks such that the K counting values are distributed in one between lower and upper halves of the set range,
    wherein the processor resets a base code and a lower half code during a booting period, such that a join code corresponding to the minimum value of the K counting values, which are checked by joining the K count codes and the base code corresponding to the base value, is equal to or larger than the base code, and becomes smaller than the lower half code larger than the base code by a half value of the count code,
    wherein K is a natural number greater than 2, and N is a value of 2 to the power of T, where T is an integer equal to or greater than 1.

2. The memory system of claim 1, wherein the processor resets a code to a limit code corresponding to the limit value, the code being obtained by adding a range code corresponding to the set range to the base code reset during the booting period and subtracting 1 from the added value.

3. The memory system of claim 2, wherein the controller performs a first wear-leveling operation on the K memory blocks such that a join code corresponding to the maximum value of the K counting values becomes smaller than the lower half code, during a wear-leveling period after the booting period.

4. The memory system of claim 3, wherein when it is determined that the join code corresponding to the maximum value of the K counting values is equal to or larger than the lower half code after the first wear-leveling operation was performed during the wear-leveling period, the controller performs a second wear-leveling operation on the K memory blocks, such that the join code corresponding to the minimum value of the K counting values becomes equal to or larger than the lower half code, and the join code corresponding to the maximum value of the K counting values becomes smaller than an upper half code larger by a half value of the count code than the lower half code.

5. The memory system of claim 4, wherein when it is determined that the join code corresponding to the minimum value of the K counting values is equal to or larger than the lower half code after the controller performed the second wear-leveling operation during the wear-leveling period, the processor resets the lower half code to the base code, resets a code to the limit code, the code being obtained by adding the range code to the base code reset during the wear-leveling period and subtracting 1 from the added value, resets a code to the lower half code, the code being larger by a half value of the count code than the base code reset during the wear-leveling period, and resets a code to the upper half code, the code being larger by a half value of the count code than the lower half code reset during the wear-leveling period.

6. The memory system of claim 5, wherein the controller reads the base code from a select memory block among the K memory blocks during the booting period, and when the base code is reset through the operation of the processor during the booting period or the wear-leveling period, the controller stores the reset base code in the select memory block.

7. The memory system of claim 6, wherein the controller further comprises a memory, wherein the controller reads the K count codes from the respective K memory blocks or the select memory block during the booting period or the wear-leveling period, and controls the memory to manage the read count codes, wherein when a count code among the K count codes is updated by one of the select operations after the booting period, the controller stores the updated count code in the corresponding memory blocks or the select memory block at a specific point of time.

8. The memory system of claim 5, wherein each of the base code, the join code, the lower half code, the upper half code and the limit code has the N-bit or greater size, and the range code has (N+1)-bit size and a greater value than the maximum value of the count code by a value of 1.

9. The memory system of claim 8, wherein the processor generates the join codes corresponding to the K counting values by adding the K count codes to the base code, respectively, during the booting period or the wear-leveling period.

10. An operating method of a memory system which includes a nonvolatile memory device having K memory blocks, the operating method comprising:

managing K counting values representing added numbers of select operations performed on the K memory blocks by using K count codes, each having an N-bit size and representing numbers of times the select operations are performed on the K memory blocks, respectively, each of the K counting values having a set range defined by a base value and a limit value, which are different for each of the K counting values, and the set range for each counting value overlapping the set range of at least one other counting value of the K counting values;

adjusting the base value and the limit value of a select counting value by using the corresponding count code in the form of a (N−1)-bit chain depending on a distribution of the K counting values managed by the managing of the K counting values; and performing a wear-leveling operation on the K memory blocks such that the K counting values managed by the managing of the K counting values are distributed in one between lower and upper halves of the set range, wherein the adjusting of the values comprises: checking, in a first check step, the K counting values by joining the K count codes and a base code corresponding to the base value during a booting period; and resetting, in a first reset step, the base code and a lower half code such that a join code corresponding to the minimum value of the K counting values checked in the first check step is equal to or larger than the base code, and becomes smaller than the lower half code larger than the base code by a half value of the count code, wherein K is a natural number greater than 2, and N is a value of 2 to the power of T, where T is an integer equal to or greater than 1.

11. The operating method of claim 10, wherein the adjusting of the values further comprises resetting, in a second reset step, a code to a limit code corresponding to the limit value, the code being obtained by adding a range code corresponding to the set range to the base code reset in the first reset step and subtracting 1 from the added value.

12. The operating method of claim 11, wherein the performing of the wear-leveling operation comprises:

checking, in a second check step, the K counting values by joining the K count codes and the base code corresponding to the base value during a wear-leveling period after the booting period; and performing, in a first leveling step, a wear-leveling operation on the K memory blocks such that a join code corresponding to the maximum value of the K counting values checked in the second check step becomes smaller than the lower half code.

13. The operating method of claim 12, wherein the performing of the wear-leveling operation further comprises performing, in a second leveling step, a wear-leveling operation on the K memory blocks such that the join code corresponding to the minimum value of the K counting values checked through the second check step becomes equal to or larger than the lower half code, and the join code corresponding to the maximum value of the K counting values becomes smaller than an upper half code larger by a half value of the count code than the lower half code, when it is determined that the join code corresponding to the maximum value of the K counting values checked through the second check step is equal to or larger than the lower half code, after the first wear-leveling operation.

14. The operating method of claim 13, wherein the adjusting of the values comprises:

checking, in a third check step, the K counting values by joining the K count codes and the base code corresponding to the base value, after the second leveling step; and resetting, in a third reset step, the lower half code to the base code, resetting a code to the limit code, the code being obtained by adding the range code to the base code reset during the wear-leveling period and subtracting 1 from the added value, resetting a code to the lower half code, the code being larger by a half value of the count code than the base code reset during the wear-leveling period, and resetting a code to the upper half code, the code being larger by a half value of the count code than the lower half code reset during the wear-leveling period, when it is determined that the join code corresponding to the minimum value of the K counting values checked through the third check step is equal to or larger than the lower half code.

15. The operating method of claim 14, further comprising:

reading the base code from a select memory block of the K memory blocks during the booting period; and storing the base code reset during the booting period or the wear-leveling period into the select memory block, in case where the base code is reset.

16. The operating method of claim 15, wherein the memory system further includes a memory,
wherein the operating method further comprises:
reading the K count codes from the respective K memory blocks or the select memory block during the booting period or the wear-leveling period, and controlling the memory to manage the read count codes, and
storing a count code among the K count codes into the corresponding memory blocks or the select memory block at a specific point of time, when the count code is updated through one of the select operations after the booting period.

17. The operating method of claim 14,
wherein each of the base code, the join code, the lower half code, the upper half code and the limit code has the N-bit or greater size, and
the range code has (N+1)-bit size and a greater value than the maximum value of the count code by a value of 1.

18. The operating method of claim 17, wherein each of the first to third check steps comprises generating the join codes corresponding to the K counting values by adding the K count codes to the base code, respectively.

* * * * *